(12) United States Patent
Shin et al.

(10) Patent No.: US 11,082,023 B2
(45) Date of Patent: Aug. 3, 2021

(54) MULTI-LAYER RAISED FRAME IN BULK ACOUSTIC WAVE DEVICE

(71) Applicant: Skyworks Global Pte. Ltd., Singapore (SG)

(72) Inventors: Kwang Jae Shin, Yongin-si (KR); Jiansong Liu, Irvine, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 32 days.

(21) Appl. No.: 16/576,529

(22) Filed: Sep. 19, 2019

(65) Prior Publication Data
US 2020/0099359 A1    Mar. 26, 2020

Related U.S. Application Data

(60) Provisional application No. 62/735,523, filed on Sep. 24, 2018, provisional application No. 62/760,470, filed on Nov. 13, 2018.

(51) Int. Cl.
| | |
|---|---|
| *H03H 9/02* | (2006.01) |
| *H03H 9/17* | (2006.01) |
| *H03H 9/56* | (2006.01) |
| *H03H 9/05* | (2006.01) |
| *H03H 9/13* | (2006.01) |

(Continued)

(52) U.S. Cl.
CPC ......... *H03H 9/02118* (2013.01); *H03F 3/189* (2013.01); *H03H 9/0561* (2013.01); *H03H 9/13* (2013.01); *H03H 9/173* (2013.01); *H03H 9/175* (2013.01); *H03H 9/564* (2013.01); *H03H 9/568* (2013.01); *H03H 9/706* (2013.01);

(Continued)

(58) Field of Classification Search
CPC .... H03H 9/02; H03H 9/02118; H03H 9/0561; H03H 9/17; H03H 9/173; H03H 9/54; H03H 9/56
See application file for complete search history.

(56) References Cited

U.S. PATENT DOCUMENTS

| | | |
|---|---|---|
| 6,476,536 B1 | 11/2002 | Pensala |
| 6,548,943 B2 | 4/2003 | Kaitila et al. |

(Continued)

FOREIGN PATENT DOCUMENTS

| | | |
|---|---|---|
| GB | 2418791 | 4/2006 |

OTHER PUBLICATIONS

Ohara, et al., "Suppression of Acoustic Energy Leakage in FBARs with Al Bottom Electrode: FEM Simulation and Experimental Results," 2007 IEEE Ultrasonics Symposium, pp. 1657-1660.

(Continued)

*Primary Examiner* — Dean O Takaoka
(74) *Attorney, Agent, or Firm* — Knobbe, Martens, Olson & Bear, LLP

(57) ABSTRACT

Aspects of this disclosure relate to a bulk acoustic wave device that includes a multi-layer raised frame structure. The multi-layer raised frame structure includes a first raised frame layer positioned between a first electrode and a second electrode of the bulk acoustic wave device. The first raised frame layer has a lower acoustic impedance than the first electrode. The first raised frame layer and the second raised frame layer overlap in an active region of the bulk acoustic wave device. Related filters, multiplexers, packaged modules, wireless communication devices, and methods are disclosed.

22 Claims, 15 Drawing Sheets

(51) Int. Cl.
   *H03H 9/70*   (2006.01)
   *H03F 3/189*   (2006.01)
   *H04B 1/3827*   (2015.01)
   *H03F 3/20*   (2006.01)

(52) U.S. Cl.
   CPC .......... *H03F 3/20* (2013.01); *H03F 2200/294* (2013.01); *H03F 2200/451* (2013.01); *H04B 1/3827* (2013.01)

(56) References Cited

U.S. PATENT DOCUMENTS

| | | | | |
|---|---|---|---|---|
| 6,812,619 B1* | 11/2004 | Kaitila | ................ | H03H 9/132 310/320 |
| 7,280,007 B2 | 10/2007 | Feng et al. | | |
| 7,369,013 B2 | 5/2008 | Fazzio et al. | | |
| 7,554,426 B2 | 6/2009 | Lee et al. | | |
| 7,602,102 B1 | 10/2009 | Barber et al. | | |
| 7,805,820 B2 | 10/2010 | Eggs et al. | | |
| 7,978,025 B2* | 7/2011 | Yokoyama | ............ | H03H 9/174 333/133 |
| 8,248,185 B2 | 8/2012 | Choy et al. | | |
| 8,441,328 B2 | 5/2013 | Shin | | |
| 8,476,995 B2 | 7/2013 | Shin | | |
| 8,483,104 B1* | 7/2013 | Saji | ................ | H04B 1/006 370/276 |
| 8,981,876 B2 | 3/2015 | Jamneala et al. | | |
| 9,148,117 B2 | 9/2015 | Burak et al. | | |
| 2009/0134957 A1 | 5/2009 | Shin | | |
| 2014/0191826 A1 | 7/2014 | Hashimoto et al. | | |
| 2014/0225683 A1* | 8/2014 | Burak | ................ | H03H 9/02102 333/187 |
| 2014/0232486 A1* | 8/2014 | Burak | ................ | H03H 9/175 333/187 |
| 2014/0273881 A1 | 9/2014 | Tajic | | |
| 2015/0280687 A1* | 10/2015 | Burak | ................ | H03H 9/175 310/321 |
| 2016/0126930 A1* | 5/2016 | Zou | ............ | H01L 41/047 333/187 |
| 2017/0033769 A1* | 2/2017 | Yokoyama | ............ | H03H 9/175 |
| 2017/0170809 A1 | 6/2017 | Yokoyama et al. | | |
| 2017/0207768 A1 | 7/2017 | Liu et al. | | |
| 2017/0230031 A1 | 8/2017 | Yokoyama et al. | | |
| 2017/0366157 A1 | 12/2017 | Liu et al. | | |
| 2018/0013397 A1 | 1/2018 | Lim et al. | | |
| 2018/0175275 A1 | 6/2018 | Nishihara et al. | | |
| 2018/0219528 A1 | 8/2018 | Liu et al. | | |
| 2018/0294794 A1 | 10/2018 | Liu et al. | | |

OTHER PUBLICATIONS

Thalhammer, et al., "Spurious mode suppression in BAW resonators," 2006 IEEE Ultrasonics Symposium, pp. 456-459.

Fattinger, et al., "Optimization of Acoustic Dispersion for High Performance Thin Film BAW Resonators," 2005 IEEE Ultrasonics Symposium, pp. 1175-1178.

Kaitila, et al., "Spurious Resonance Free Bulk Acoustic Wave Resonators," 2003 IEEE Ultrasonics Symposium.

* cited by examiner

MULTI-LAYER RAISED FRAME IN BULK ACOUSTIC WAVE DEVICE

CROSS REFERENCE TO PRIORITY APPLICATION

This application claims the benefit of priority of U.S. Provisional Patent Application No. 62/735,523, filed Sep. 24, 2018 and titled "MULTI-LAYER RAISED FRAME IN BULK ACOUSTIC WAVE DEVICE," and also claims the benefit of priority of U.S. Provisional Patent Application No. 62/760,470, filed Nov. 13, 2018 and titled "MULTI-LAYER RAISED FRAME IN BULK ACOUSTIC WAVE DEVICE," the disclosures of each of which are hereby incorporated by reference in their entireties herein.

BACKGROUND

Technical Field

Embodiments of this disclosure relate to acoustic wave devices and, more specifically, to bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

For high performance BAW filters, low insertion loss and low Gamma loss is generally desirable. However, desired levels of insertion loss and Gamma loss can be difficult to achieve.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a bulk acoustic wave device that includes a first electrode, a second electrode, a piezoelectric layer positioned between the first electrode and the second electrode, and a multi-layer raised frame structure outside of a middle area of an active region of the bulk acoustic wave device. The multi-layer raised frame structure includes a first raised frame layer and a second raised frame layer. The first raised frame layer is positioned between the first electrode and the second electrode. The first raised frame layer has a lower acoustic impedance than the first electrode. The second raised frame layer overlaps with the first raised frame layer in the active region.

The first raised frame layer can move a frequency of a raised frame mode away from a main resonant frequency of the bulk acoustic wave device. The acoustic impedance of the first raised frame layer can be lower than an acoustic impedance of the piezoelectric layer. The first raised frame layer can be a silicon dioxide layer. The first raised frame layer can be positioned between the piezoelectric layer and the first electrode. The first raised frame layer can be disposed in a raised frame domain of the bulk acoustic wave device along an edge of the active domain. The bulk acoustic wave device can further include a recessed frame domain between the raised frame domain and the middle area.

The multi-layer raised frame structure can block lateral energy leakage from the active region to a passive region of the bulk acoustic wave device.

The first electrode can include molybdenum. The first electrode can include tungsten. The first electrode can include ruthenium. The first electrode can include platinum. The first electrode can include iridium. The first electrode can include any suitable alloy of molybdenum, tungsten, ruthenium, platinum, and/or iridium.

The second raised frame layer and the piezoelectric layer can be disposed on opposite sides of the second electrode. The first raised frame layer can be positioned between the piezoelectric layer and the second electrode. The second raised frame layer can have a higher density than the piezoelectric layer. The second raised frame layer includes the same material as the second electrode. The second raised frame layer can also include the same material as the first electrode.

The bulk acoustic wave device can include a passivation layer over the multi-layer raised frame layer. The bulk acoustic wave device can include a silicon dioxide layer over the multi-layer raised frame layer.

The bulk acoustic wave device can include an air cavity, in which the air cavity and the piezoelectric layer are on opposite sides of the first electrode.

The bulk acoustic wave device can include an acoustic Bragg reflector, in which the acoustic Bragg reflector and the piezoelectric layer are on opposite sides of the first electrode.

Another aspect of this disclosure is a multiplexer that includes a first filter having a first passband and a second filter having a second passband. The first filter includes a bulk acoustic wave device. The bulk acoustic wave device includes a multi-layer raised frame structure outside of a middle area of an active region of the bulk acoustic wave device. The multi-layer raised frame structure includes a first raised frame layer and a second raised frame layer. The first raised frame layer is positioned between an electrode and a piezoelectric layer. The first raised frame layer has a lower acoustic impedance than the electrode. The second raised frame layer overlaps with the first raised frame layer in the active region. The second filter is coupled to the first acoustic wave filter at a common node. The multi-layer raised frame structure is configured to move a raised frame mode of the bulk acoustic wave device away from the second passband.

The acoustic impedance of the first raised frame layer can be lower than an acoustic impedance of the piezoelectric layer. The first acoustic filter can further include a second bulk acoustic wave device, in which the second bulk acoustic wave device includes a second multi-layer raised frame structure outside of a middle area of an active region of the second bulk acoustic wave device.

The second filter can be an acoustic wave filter. The multiplexer can include one or more additional filters coupled to the common node.

The common node can receive a carrier aggregation signal including at least a first carrier associated with the first passband and a second carrier associated with the second passband.

The multi-layer raised frame mode can cause a reflection coefficient of the first acoustic wave filter in the second passband to be increased.

Another aspect of this disclosure is a packaged module that includes a packaging substrate, an acoustic wave filter on the packaging substrate and configured to filter a radio frequency signal, and a radio frequency component electrically coupled to the acoustic wave filter and positioned on the packaging substrate. The acoustic wave filter and the radio frequency component are enclosed within a common package. The acoustic wave filter includes a bulk acoustic wave device. The bulk acoustic wave device includes a multi-layer raised frame structure outside of a middle area of an active region of the bulk acoustic wave device. The multi-layer raised frame structure includes a first raised frame layer and a second raised frame layer. The first raised frame layer is positioned between an electrode and a piezoelectric layer. The first raised frame layer has a lower acoustic impedance than the electrode. The second raised frame layer overlap with the first raised frame layer in the active region.

The radio frequency component can includes a radio frequency amplifier, such as a power amplifier or a low noise amplifier. The radio frequency component can include a radio frequency switch.

Another aspect of this disclosure is a bulk acoustic wave device that includes a first electrode, a second electrode, a piezoelectric layer positioned between the first electrode and the second electrode, and a multi-layer raised frame structure outside of a middle area of an active region of the bulk acoustic wave device. The multi-layer raised frame structure includes a first raised frame layer and a second raised frame layer. The first raised frame layer is positioned between the first electrode and the second electrode. The first raised frame layer has a lower acoustic impedance than the piezoelectric layer. The second raised frame layer overlaps with the first raised frame layer in the active region.

The first raised frame layer can move a frequency of a raised frame mode away from a main resonant frequency of the bulk acoustic wave device. The first raised frame layer can be a silicon dioxide layer. The first raised frame layer can be positioned between the piezoelectric layer and the first electrode. The first raised frame layer can be disposed in a raised frame domain of the bulk acoustic wave device along an edge of the active domain. The bulk acoustic wave device can further include a recessed frame domain between the raised frame domain and the middle area.

The multi-layer raised frame structure can block lateral energy leakage from the active region to a passive region of the bulk acoustic wave device.

The first electrode can include molybdenum. The first electrode can include tungsten. The first electrode can include ruthenium.

The second raised frame layer and the piezoelectric layer can be disposed on opposite sides of the second electrode. The first raised frame layer can be positioned between the piezoelectric layer and the second electrode. The second raised frame layer can have a higher density than the piezoelectric layer. The second raised frame layer includes the same material as the second electrode. The second raised frame layer can also include the same material as the first electrode.

The bulk acoustic wave device can include a passivation layer over the multi-layer raised frame layer. The bulk acoustic wave device can include a silicon dioxide layer over the multi-layer raised frame layer.

The bulk acoustic wave device can include an air cavity, in which the air cavity and the piezoelectric layer are on opposite sides of the first electrode.

The bulk acoustic wave device can include an acoustic Bragg reflector, in which the acoustic Bragg reflector and the piezoelectric layer are on opposite sides of the first electrode.

The bulk acoustic wave device can be included in any suitable filter, multiplexer and/or module disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
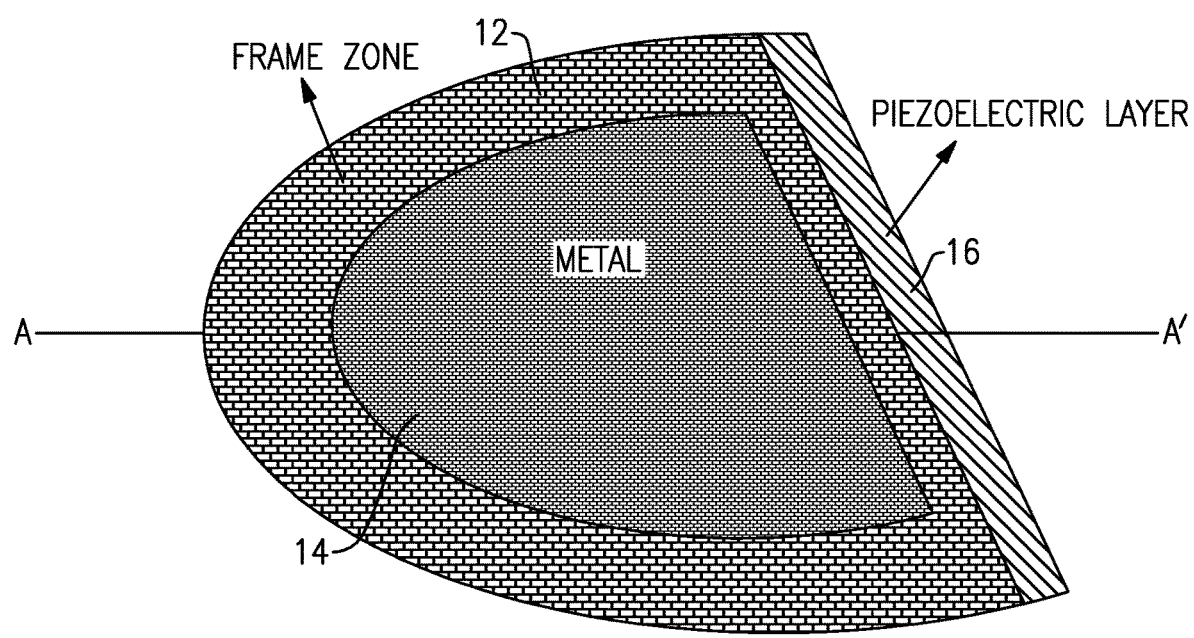
FIG. 1 is a plan view of a dual raised frame bulk acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

For developing high performance bulk acoustic wave (BAW) filters, reducing insertion loss and decreasing Gamma loss is generally desirable. To achieve a low insertion loss, BAW resonators typically have a high quality factor (Q). To achieve a high Q, a raised frame, which can be referred to as a border ring, can block lateral energy leakage from an active domain of a BAW resonator to a passive domain of the BAW resonator. A raised frame can improve Q, although it may not be able to trap all leakage energy. The raised frame can generate a relatively large spurious mode, which can be referred to as raised frame mode, below a main resonant frequency of a BAW resonator. This can cause Gamma degradation in carrier aggregation bands for a filter. Gamma can refer to a reflection coefficient. A low Gamma loss can be achieved with a raised frame spurious mode (RaF mode) away from carrier aggregation bands.

Aspects of this disclosure relate to a bulk acoustic wave resonator that includes a multi-layer raised frame structure that can achieve low insertion loss and low Gamma loss. The multi-layer raised frame structure includes a first raised frame layer and a second raised frame layer. The first raised frame layer includes a low acoustic impedance material, such as silicon dioxide, disposed between electrodes that are on opposing sides of a piezoelectric layer. For instance, the low acoustic impedance material can be disposed between a top electrode and a piezoelectric layer of a bulk acoustic wave resonator. The multi-layer raised frame structure can be disposed along a perimeter of an active region of the bulk acoustic wave resonator. The second raised frame layer can include a relatively heavy material. The second raised frame layer can be the same material as an electrode of the bulk acoustic wave resonator.

Due to a low acoustic impedance, the frequency of a multi-layer raised frame domain generating a relatively strong raised frame spurious mode can be significantly lower than for a similar raised frame domain without the first raised frame layer with a low acoustic impedance. With the low acoustic impedance, the raised frame mode for the multi-layer raised frame structure can be outside of a carrier aggregation band so as not to provide a Gamma loss. For example, in a carrier aggregation application, a multiplexer can include a common node arranged to receive a carrier aggregation signal, a first filter having a passband associated with a first carrier of the carrier aggregation signal, and a second filter coupled to the first filter at the common node and having a second passband associated with a second carrier of the carrier aggregation signal. The first filter can include a BAW resonator with a multi-layer raised frame structure according to an embodiment disclosed herein. The BAW resonator with the multi-layer raised frame structure can increase Gamma for the first filter in the passband of the second filter.

Additionally, due to a relatively low frequency of the multi-layer raised frame structure, the difference between the effective acoustic impedance of the multi-layer raised frame domain and the active domain is larger than for a raised frame structure that includes a single layer corresponding to the second raised frame layer. The multi-layer raised frame structure can provide a high mode reflection of a lateral energy and decrease mode conversion from main mode to other lateral modes around the anti-resonance frequency. Accordingly, Q can be significantly increased.

Although embodiments disclosed herein may be discussed with reference to a dual raised frame structure with two raised frame layers, any suitable principles and advantages discussed herein can be applied to a multi-layer raised frame structure that includes two or more raised frame layers.

Example bulk acoustic resonators with dual raised frame layers will now be discussed. Any suitable principles and advantages of these dual raised frame layers can be implemented together with each other in a multi-layer raised frame bulk acoustic wave device.

FIG. 1 is a plan view of a dual raised frame bulk acoustic wave device. As shown in FIG. 1, the bulk acoustic wave device includes a raised frame zone 12 around the perimeter of an active region of the bulk acoustic wave device. The raised frame zone 12 can be referred to as a border ring in certain instances. A dual raised frame structure can be in the raised frame zone 12. The dual raised frame structure can be implemented in accordance with any suitable principles and advantages of the dual raised frame bulk acoustic wave devices of FIGS. 2 to 9. The dual raised frame structure is outside of a middle area 14 of the active region of the bulk acoustic wave device. A raised frame layer can be in the raised frame zone 12 and extend above a metal electrode. FIG. 1 illustrates the metal electrode of the middle area 14 and the raised frame layer in the raised frame zone 12. One or more other layers can be included over the metal electrode and the raised frame layer. For instance, silicon dioxide can be included over the metal electrode and the raised frame layer. FIG. 1 also illustrates that a piezoelectric layer 16 of the bulk acoustic wave device is below the metal electrode and the raised frame layer.

Embodiments of dual raised frame bulk acoustic wave devices will be discussed with reference to example cross sections along the line from A to A' of FIG. 1. FIGS. 2 to 9 illustrate example cross sections of dual raised frame bulk acoustic wave devices along the line from A to A' in FIG. 1. Any suitable combination of features of the bulk acoustic wave devices of FIGS. 2 to 9 can be combined with each other. Any of the bulk acoustic wave devices disclosed herein can be a bulk acoustic wave resonators in a filter arranged to filter a radio frequency signal.

Figure 2:
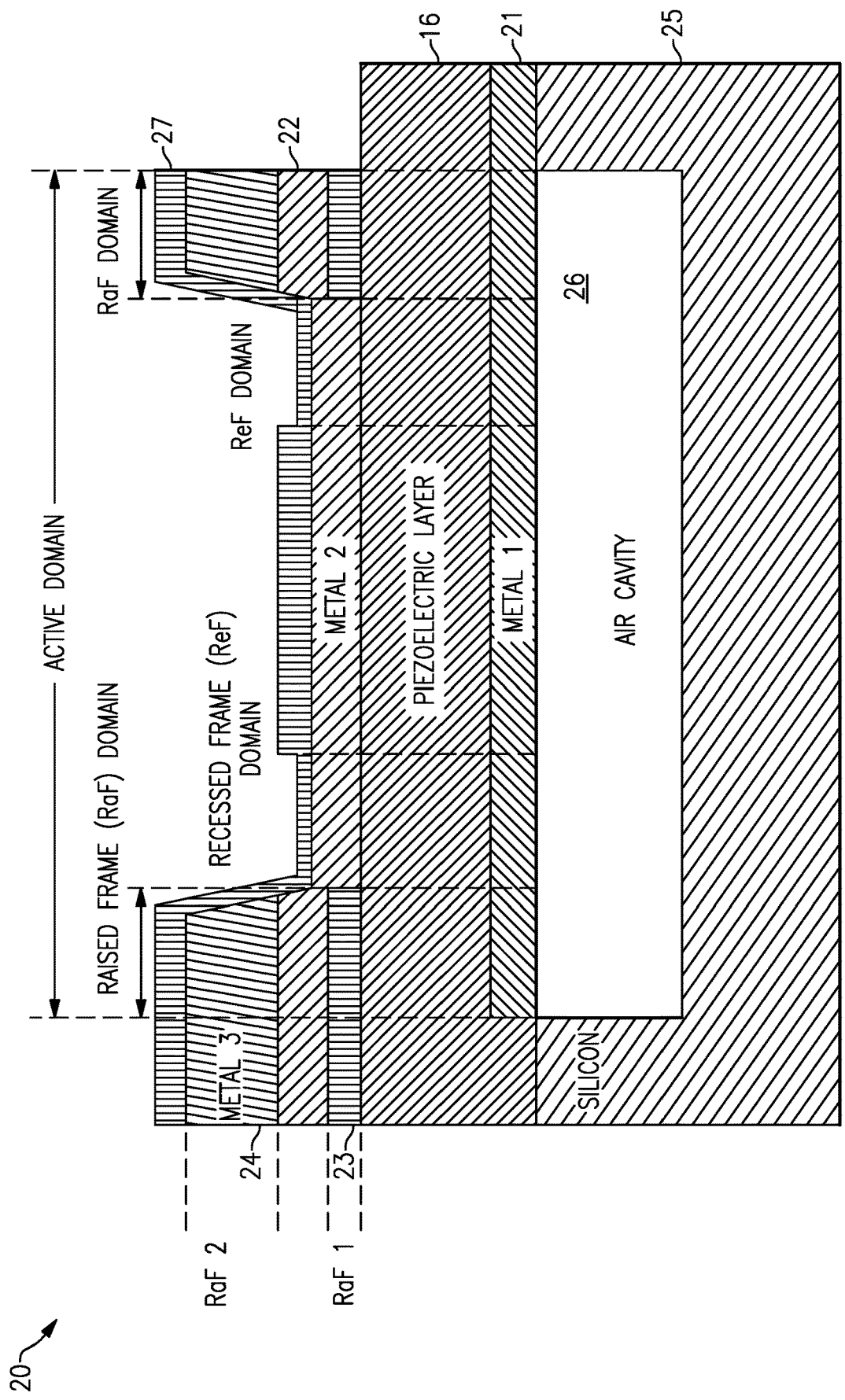
FIG. 2 is a cross sectional view of a dual raised frame bulk acoustic wave device according to an embodiment.

FIG. 2 is a cross sectional view of a dual raised frame bulk acoustic wave device 20 according to an embodiment. As illustrated, the dual raised frame bulk acoustic device 20 includes a piezoelectric layer 16, a first electrode 21, a second electrode 22, a first raised frame layer 23, a second raised frame layer 24, a silicon substrate 25, an air cavity 26, and a silicon dioxide layer 27.

The piezoelectric layer 16 is disposed between the first electrode 21 and the second electrode 22. The piezoelectric layer 16 can be an aluminum nitride (AlN) layer or any other suitable piezoelectric layer. An active region or active domain of the bulk acoustic wave device 20 is defined by the portion of the piezoelectric layer 16 that overlaps with both the first electrode 21 and the second electrode 22. The first electrode 21 can have a relatively high acoustic impedance. For example, the first electrode 21 can include molybdenum (Mo), tungsten (W), ruthenium (Ru), iridium (Ir), platinum (Pt), Ir/Pt, or any suitable alloy and/or combination thereof. Similarly, the second electrode 22 can have a relatively high acoustic impedance. The second electrode 22 can be formed of the same material as the first electrode 21 in certain instances.

The dual raised frame structure of the bulk acoustic wave device 20 includes the first raised frame layer 23 and the second raised frame layer 24. The first raised frame layer 23 and the second raised frame layer 24 overlap with each other in the active region of the bulk acoustic wave device 20. A raised frame domain of the bulk acoustic wave device 20 is defined by the portion of dual raised frame structure in the active domain of the bulk acoustic wave device 20. At least a portion of the dual raised frame structure is included in an active region of the bulk acoustic wave device 20. The dual raised frame structure can improve Q significantly due to highly efficient reflection of lateral energy.

The first raised frame layer 23 is positioned between the first electrode 21 and the second electrode 22. As illustrated in FIG. 2, the first raised frame layer 23 is positioned between the piezoelectric layer 16 and the second electrode 22. The first raised frame layer 23 is a low acoustic impedance material. The low acoustic impedance material has a lower acoustic impedance than the first electrode 21. The low acoustic impedance material has a lower acoustic impedance than the second electrode 22. The low acoustic impedance material can have a lower acoustic impedance than the piezoelectric layer 16. As an example, the first raised frame layer 23 can be a silicon dioxide ($SiO_2$) layer. Because silicon dioxide is already used in a variety of bulk acoustic wave devices, a silicon dioxide first raised frame layer 23 can be relatively easy to manufacture. The first raised frame layer 23 can be a silicon nitride (SiN) layer, a silicon carbide (SiC) layer, or any other suitable low acoustic impedance layer. The first raised frame layer 23 can have a relatively low density. The first raised frame layer 23 can extend beyond the active region of the bulk acoustic wave device 20 as shown in FIG. 2. This can be for manufacturability reasons in certain instances.

The first raised frame layer 23 can reduce an effective electromechanical coupling coefficient ($k^2$) of the raised frame domain of the bulk acoustic wave device 20 relative to a similar device without the first raised frame layer 23. This can reduce excitation strength of a raised frame spurious mode. Moreover, the first raised frame layer 23 can contribute to move the frequency of the raised frame mode relatively far away from the main resonant frequency of the bulk acoustic wave device 20, which can result in no significant effect on a Gamma loss.

As illustrated, the second raised frame layer 24 overlaps with the first raised frame layer 23 in the active region of the bulk acoustic wave device 20. The second raised frame layer 24 can be the same material as the second electrode 22. This can be convenient from a manufacturing perspective. The second raised frame layer 24 can be a relatively high density material. For instance, the second raised frame layer 24 can include molybdenum (Mo), tungsten (W), ruthenium (Ru), the like, or any suitable alloy thereof. The second raised frame layer 24 can be a metal layer. Alternatively, the second raised frame layer 24 can be a suitable non-metal material with a relatively high density. The density of the second raised frame layer 24 can be similar or heavier than the density of the second electrode 22. The second raised frame layer 24 can have a relatively high acoustic impedance.

The second raised frame layer 24 increases the height of the bulk acoustic wave device 20 in the raised frame domain. Accordingly, the bulk acoustic wave device 20 has a greater height in the raised frame domain than in other portions of the active domain, such as the middle area of the active domain. Forming the second raised frame layer 24 over the second electrode 22 can be relatively easy from a manufacturing perspective. However, in some other embodiments, a second raised frame layer can be included in a different position in the stack of layers in the raised frame domain.

In the bulk acoustic wave device 20, a silicon dioxide layer 27 is included over the second electrode 22 and the second raised frame layer 24. The silicon dioxide layer 27 can be formed with different thicknesses in different regions of the bulk acoustic wave device 20. For example, as shown in FIG. 2, the silicon dioxide layer 27 is thinner in a recessed frame domain. Any suitable passivation layer can be included in place and/or in addition to the silicon dioxide layer 27.

The dual raised frame bulk acoustic wave device 20 is an FBAR. An air cavity 26 is included below the first electrode 21. The air cavity 26 is defined by the geometry of the first electrode 21 and the silicon substrate 25. Other suitable substrates can alternatively be implemented in place of the silicon substrate 25. One or more layers, such as a passivation layer, can be positioned between the first electrode 21 and the silicon substrate 25.

Although the bulk acoustic wave device 20 is an FBAR, any suitable principles and advantages discussed herein can be applied to a solidly mounted resonator (SMR).

Figure 3:
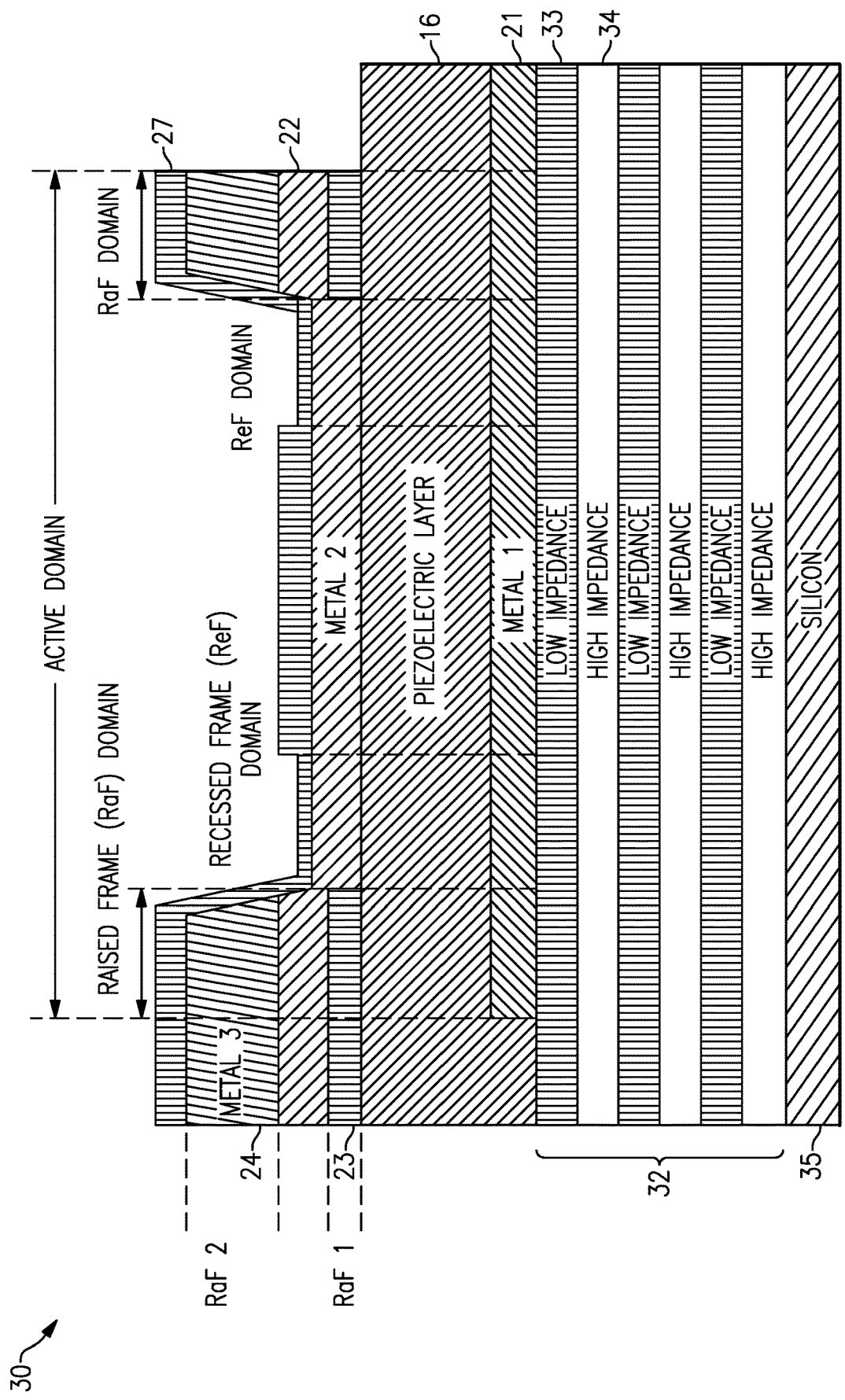
FIG. 3 is a cross sectional view of a dual raised frame bulk acoustic wave device according to another embodiment.

FIG. 3 is a cross sectional view of a dual raised frame bulk acoustic wave device 30 according to an embodiment. The dual raised frame bulk acoustic device 30 is like the dual raised frame bulk acoustic wave device 20 of FIG. 2, except that the bulk acoustic wave device 30 is an SMR instead of an FBAR. In the bulk acoustic wave device 30, a solid acoustic mirror is disposed between the first electrode 21 and a silicon substrate 35. The illustrated acoustic mirror includes acoustic Bragg reflectors 32. The illustrated acoustic Bragg reflectors 32 include alternating low impedance layers 33 and high impedance layers 34. As an example, the Bragg reflectors 32 can include alternating silicon dioxide layers as low impedance layers 33 and tungsten layers as high impedance layers 34. Any other suitable features of an SMR can alternatively or additionally be implemented in a multi-layer raised frame bulk acoustic wave device.

Figure 4:
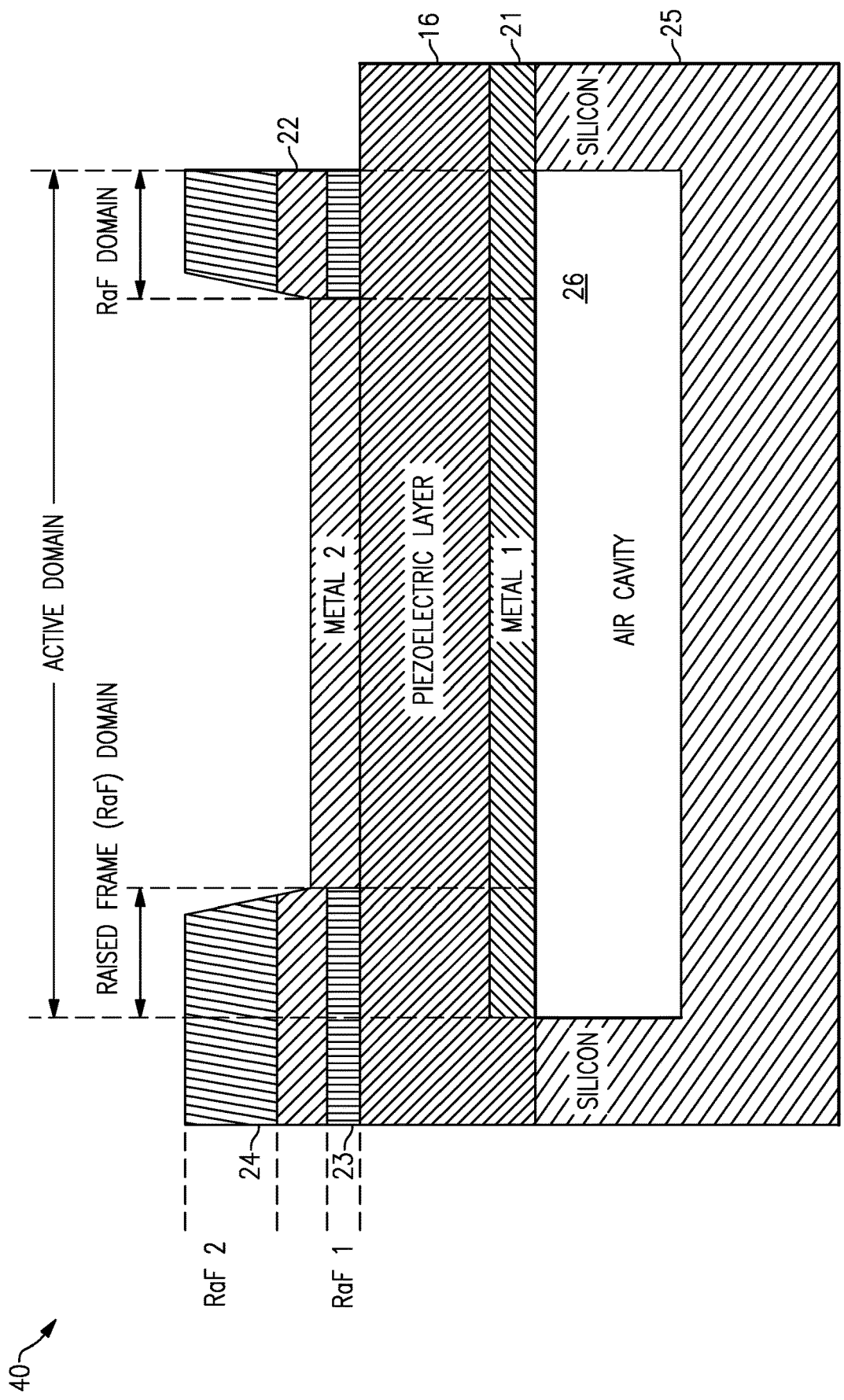
FIG. 4 is a cross sectional view of a dual raised frame bulk acoustic wave device according to another embodiment.

FIG. 4 is a cross sectional view of a dual raised frame bulk acoustic wave device 40 according to an embodiment. The dual raised frame bulk acoustic device 40 is like the dual raised frame bulk acoustic wave device 20 of FIG. 2, except that the silicon dioxide layer 27 is omitted in the bulk acoustic wave device 40 and there is no recessed framed domain in the bulk acoustic wave device 40.

Figure 5:
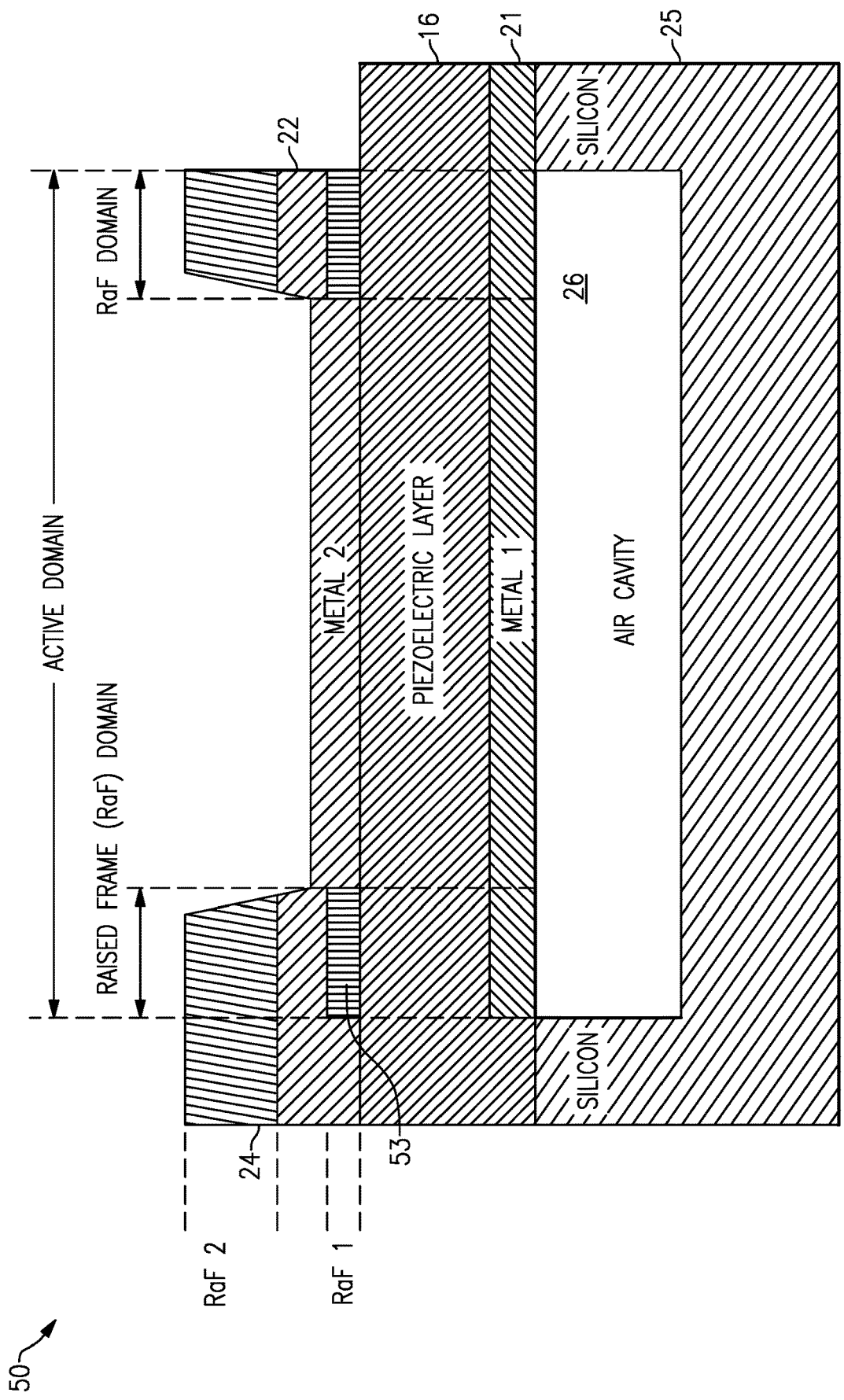
FIG. 5 is a cross sectional view of a dual raised frame bulk acoustic wave device according to another embodiment.

FIG. 5 is a cross sectional view of a dual raised frame bulk acoustic wave device 50 according to an embodiment. The dual raised frame bulk acoustic device 50 is like the dual raised frame bulk acoustic wave device 40 of FIG. 4, except that the first raised frame layer 53 of the bulk acoustic wave device 50 is different than the first raised frame layer 23 of the bulk acoustic wave device 40. As illustrated in FIG. 5, the first raised frame layer 53 spans the raised frame domain. The first raised frame layer 53 does not extend beyond the active region of the bulk acoustic wave device 50.

Figure 6:
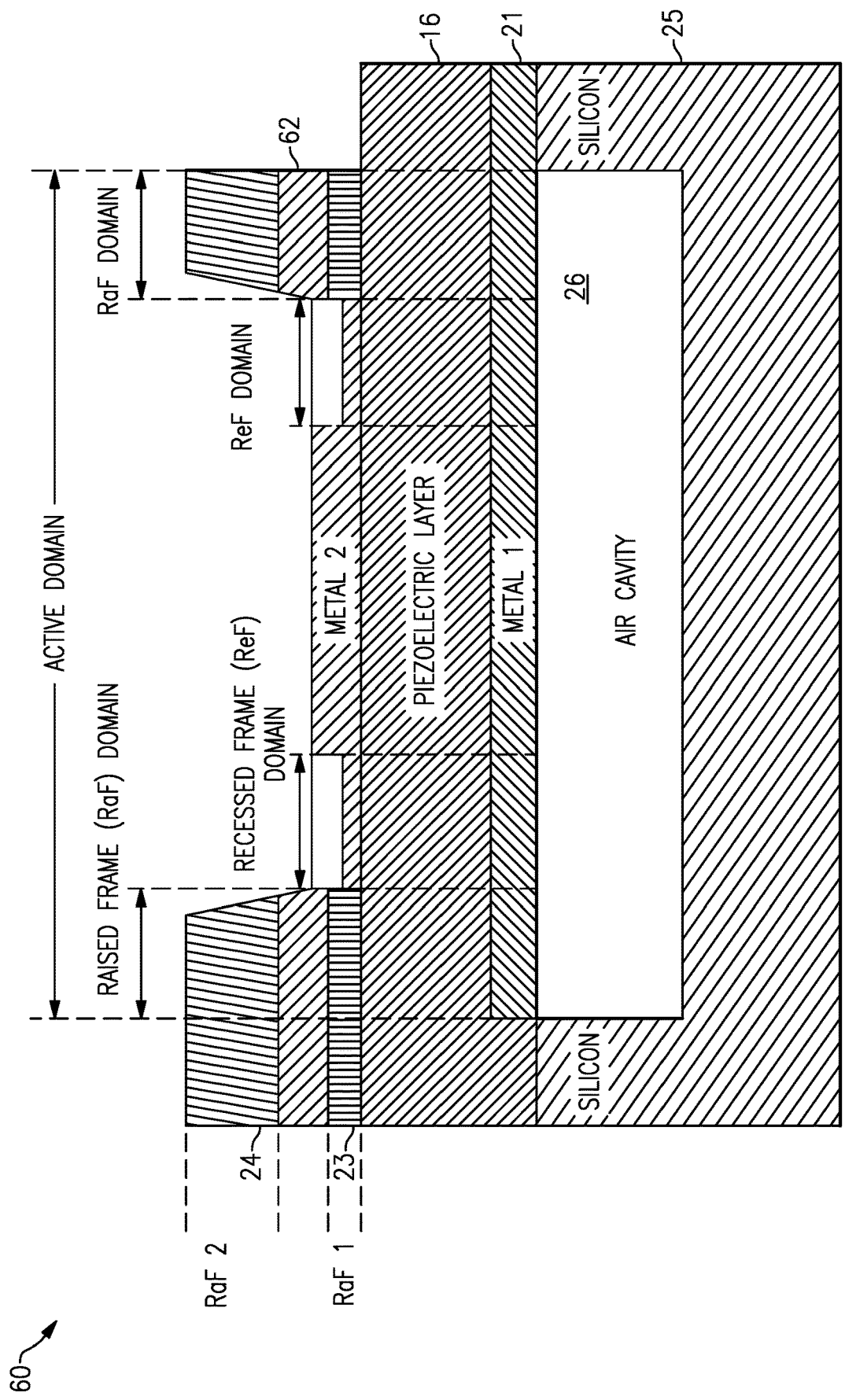
FIG. 6 is a cross sectional view of a dual raised frame bulk acoustic wave device according to another embodiment.

FIG. 6 is a cross sectional view of a dual raised frame bulk acoustic wave device 60 according to an embodiment. The dual raised frame bulk acoustic device 60 is like the dual raised frame bulk acoustic wave device 40 of FIG. 4, except that a second electrode 62 of the bulk acoustic wave device 60 is different than the second electrode 22 of the bulk acoustic wave device 40. The second electrode 62 has different thicknesses in different regions. The region where the second electrode 62 is thinner implements a recessed framed domain in the bulk acoustic wave device 60.

Figure 7A:
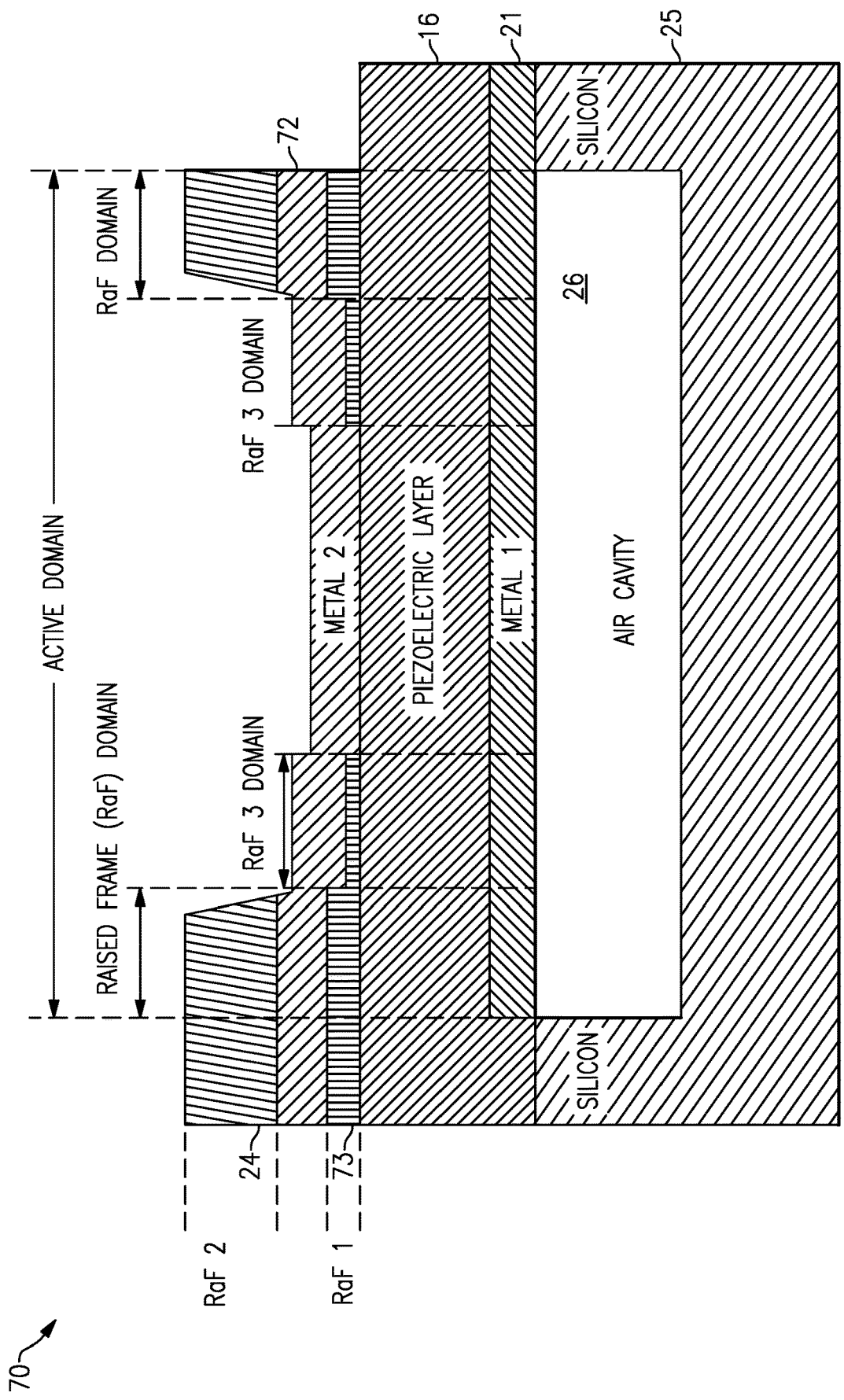
FIG. 7A is a cross sectional view of a dual raised frame bulk acoustic wave device according to another embodiment.

FIG. 7A is a cross sectional view of a dual raised frame bulk acoustic wave device 70 according to an embodiment. The dual raised frame bulk acoustic device 70 is like the dual raised frame bulk acoustic wave device 40 of FIG. 4, except that the bulk acoustic wave device 70 includes two raised frame domains. The bulk acoustic wave device 70 includes a first raised frame layer 73 in a first raised frame domain RaF and a second raised frame domain RaF3. The first raised frame domain RaF in the bulk acoustic wave device 70 is like the raised frame domain in the bulk acoustic wave device 40 of FIG. 4. The first raised frame layer 73 and the second raised frame layer 24 are included in the first raise frame domain RaF. The first raised frame layer 73 can include any suitable features of the first raised frame layer 23 of FIG. 2. The first raised frame layer 73 is thinner in the second raised frame domain RaF3 in which the first raised frame layer 73 and a second electrode 72 are over the piezoelectric layer 16.

The second raised frame region RaF3 can be referred to as a recessed raised frame region. The second electrode 72 has a different shape in cross sectional view than the second electrode 22 of FIG. 4. The second raised frame layer 24 is outside of the second raised frame domain RaF3. With the first raised frame layer 73, the second raised frame domain RaF3 has a different acoustic impedance than (1) the middle area of the active region and (2) the first raised frame domain. This can help with spurious mode suppression. The first raised frame region can surround the second raised frame region in plan view in the bulk acoustic wave device 70.

Figure 7B:
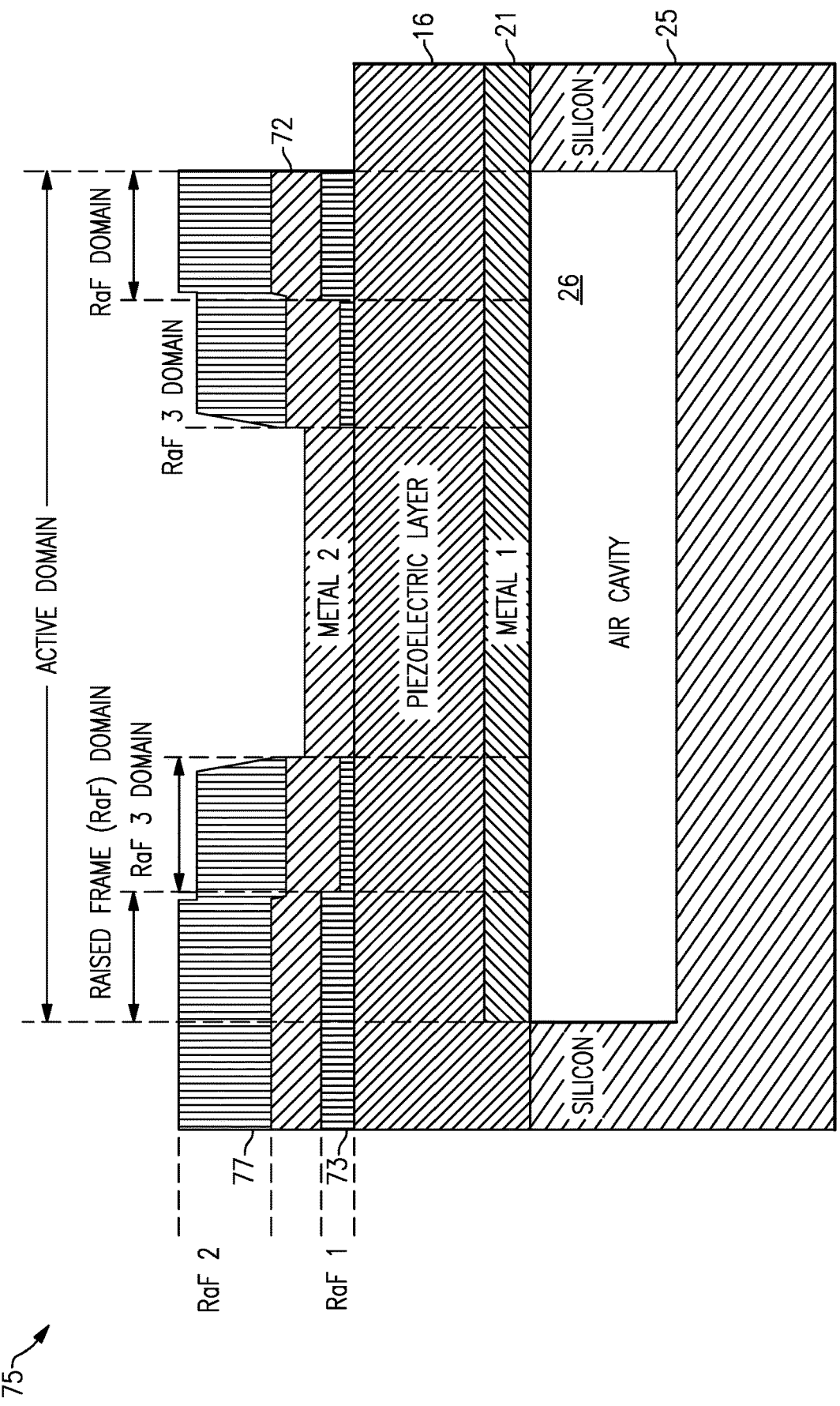
FIG. 7B is a cross sectional view of a dual raised frame bulk acoustic wave device according to another embodiment.

FIG. 7B is a cross sectional view of a dual raised frame bulk acoustic wave device 75 according to an embodiment. The dual raised frame bulk acoustic device 75 is like the dual raised frame bulk acoustic wave device 70 of FIG. 7A, except that the bulk acoustic wave device 75 includes a second raised frame layer 77 that extends over two raised frame domains. As illustrated in FIG. 7B, the second raised frame layer 77 is included in a first raised frame domain RaF and a second raised frame domain RaF3. The first raised frame layer 73 is thinner in the second raised frame domain of the bulk acoustic wave device 75. The second raised frame layer 77 has substantially the same thickness over both the first raised frame domain RaF and the second raised frame domain RaF3 in the bulk acoustic wave device 75. The two raised frame domains in the bulk acoustic wave device 75 can help with spurious mode suppression.

Figure 8:
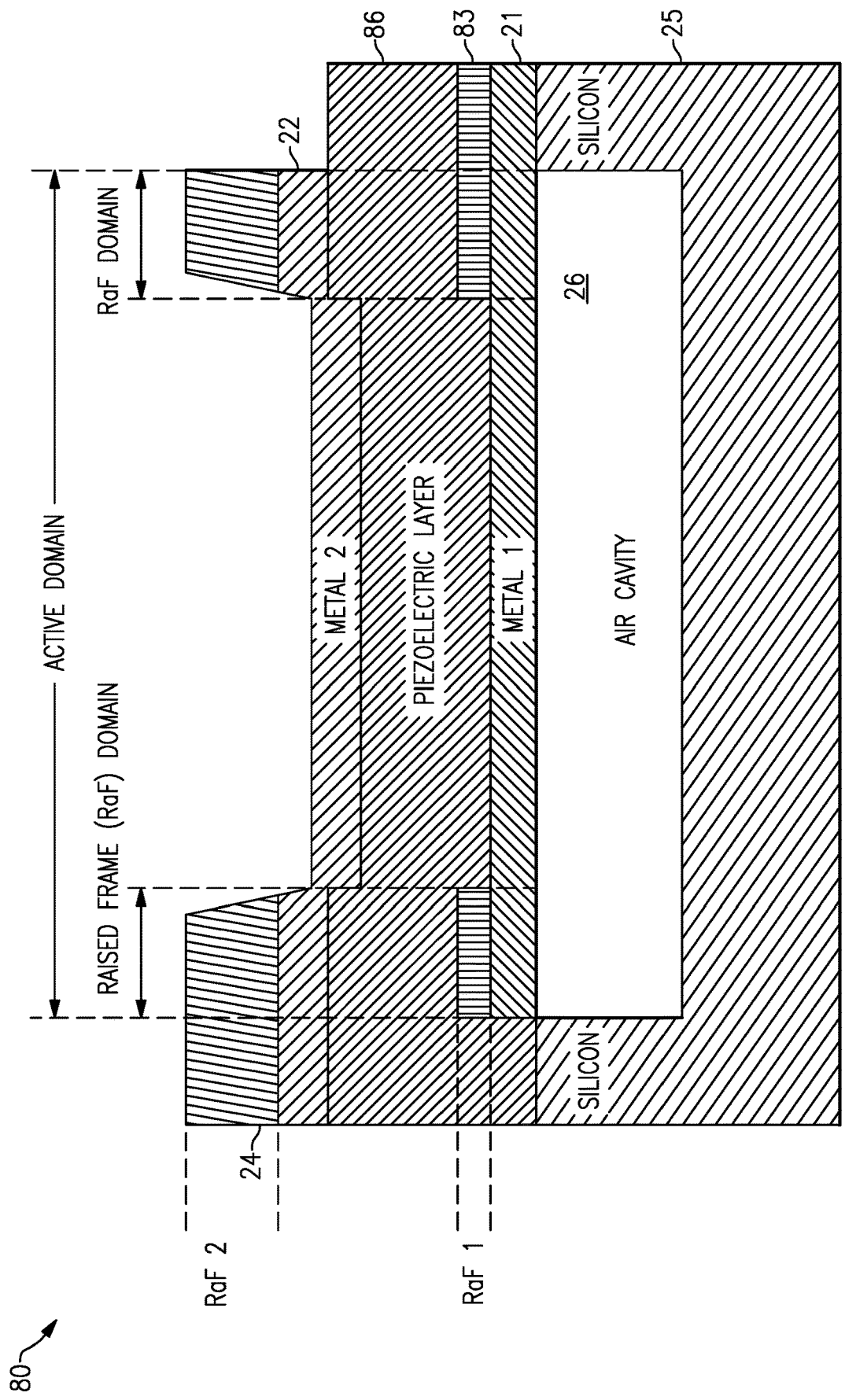
FIG. 8 is a cross sectional view of a dual raised frame bulk acoustic wave device according to another embodiment.

FIG. 8 is a cross sectional view of a dual raised frame bulk acoustic wave device 80 according to an embodiment. The dual raised frame bulk acoustic device 80 is like the dual raised frame bulk acoustic wave device 50 of FIG. 5, except that the first raised frame layer is in different positions in these devices. In the bulk acoustic wave device 80, a first raised frame layer 83 is positioned between the first electrode 21 and a piezoelectric layer 86. The first raised frame layer 83 is in physical contact with the piezoelectric layer 86 and the first electrode 21. The first raised frame layer 83 can function similarly to the first raised frame layer 23. The first raised frame layer 83 can include any suitable features of the first raised frame layer 23. The piezoelectric layer 86 has a different shape in cross sectional view than the piezoelectric layer 16 of FIG. 5.

Figure 9:
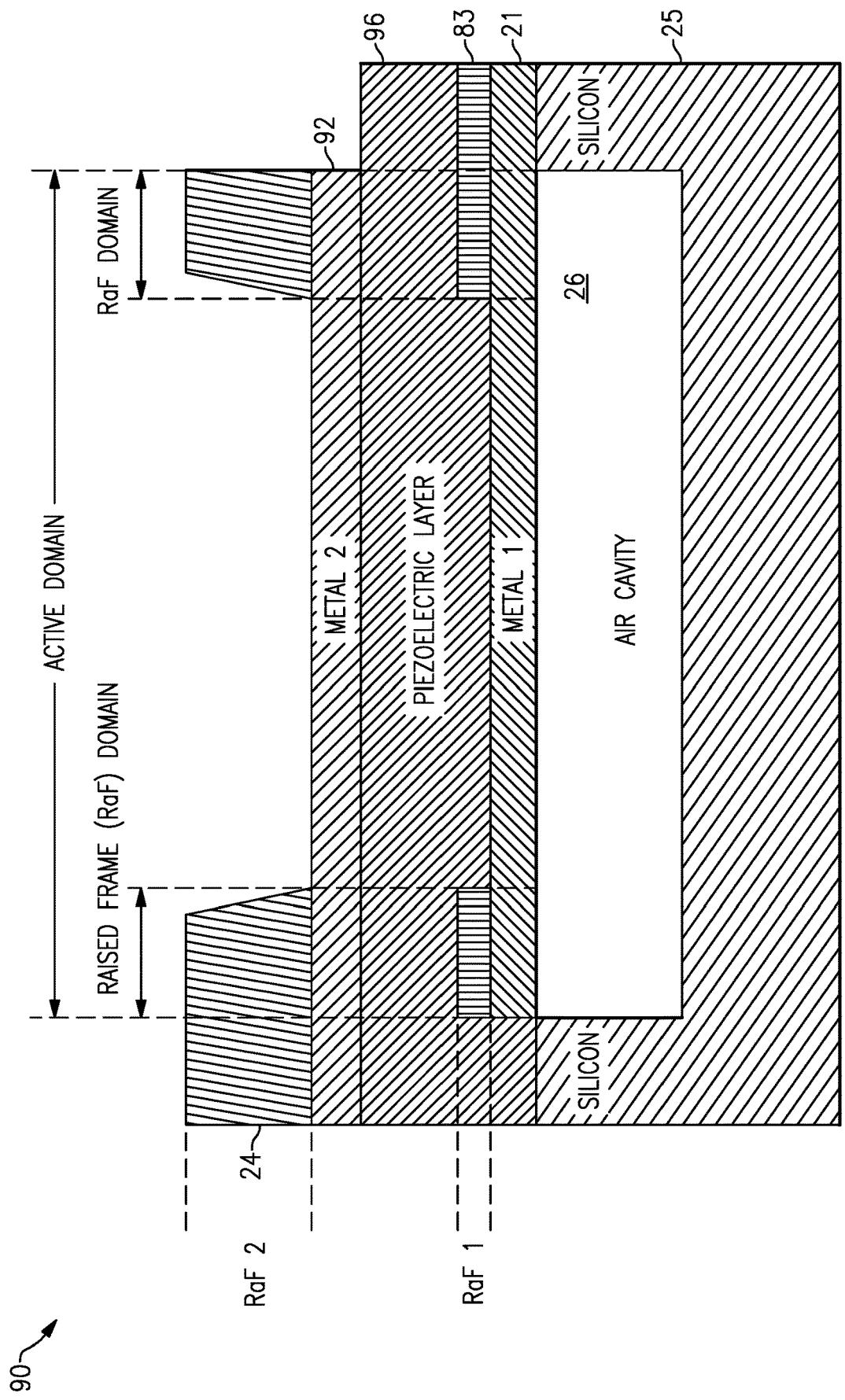
FIG. 9 is a cross sectional view of a dual raised frame bulk acoustic wave device according to another embodiment.

FIG. 9 is a cross sectional view of a dual raised frame bulk acoustic wave device 90 according to an embodiment. The dual raised frame bulk acoustic device 90 is like the dual raised frame bulk acoustic wave device 80 of FIG. 8, except that the second electrode and piezoelectric layer have different shapes in cross sectional view. As shown in FIG. 9, a second electrode 92 can have a planar top surface on which the second raised frame layer 24 is disposed. The planar top surface can make manufacturing easier in certain instances.

Figure 11A:
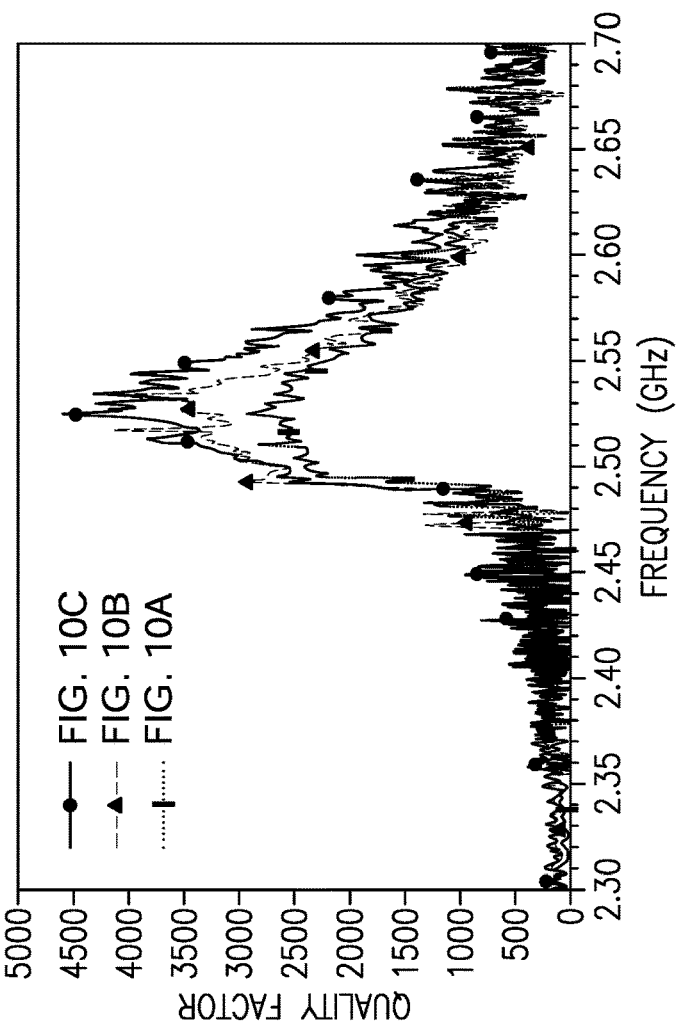
FIG. 11A is a graph that compares quality factor for the bulk acoustic wave devices of FIGS. 10A, 10B, and 10C.
Figure 10A:
FIG. 10A is a cross sectional view of a raised frame bulk acoustic wave device.
Figure 10B:
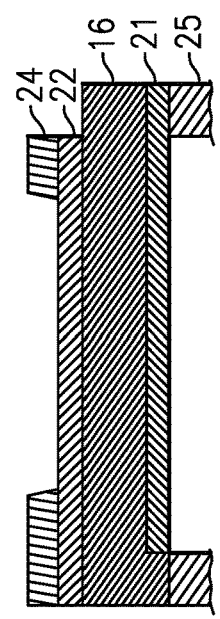
FIG. 10B is a cross sectional view of another raised frame bulk acoustic wave device.
Figure 10C:
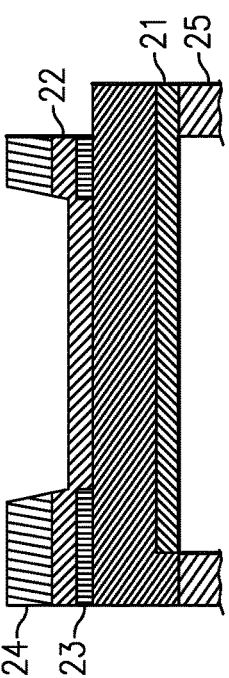
FIG. 10C is a cross sectional view of a dual raised frame bulk acoustic wave device according to an embodiment.
Figure 11B:
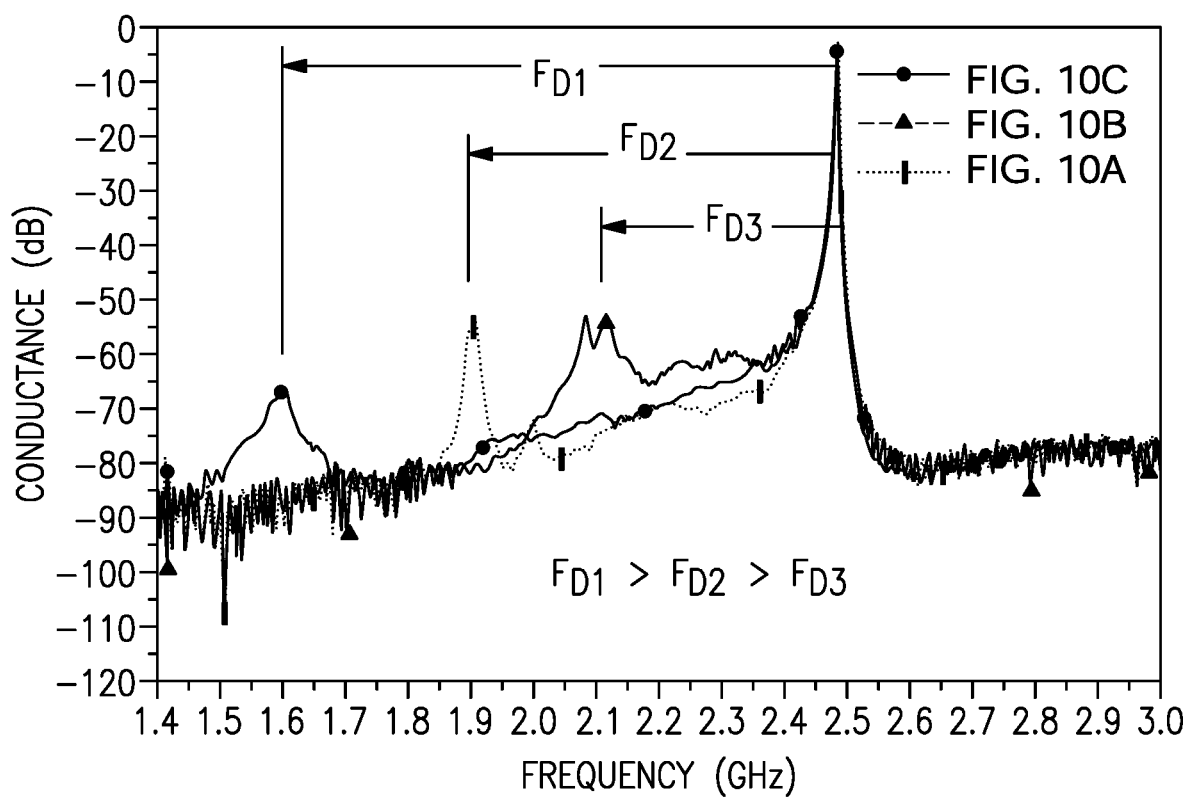
FIG. 11B is a graph that compares conductance for the bulk acoustic wave devices of FIGS. 10A, 10B, and 10C over a larger frequency range than for FIG. 11A.

As discussed above, dual raised frame bulk acoustic wave devices discussed herein can have improved Q relative to single layer raised frame devices. FIGS. 10A to 10C illustrate raised frame bulk acoustic wave devices including single raised frame bulk acoustic wave devices and a dual raised frame bulk acoustic wave device. FIGS. 11A to 11B are graphs comparing Q of the raised frame bulk acoustic wave devices of FIGS. 10A to 10C.

FIG. 10A is a cross sectional view of a raised frame bulk acoustic wave device 100. The raised frame bulk acoustic wave device 100 includes a single layer raised frame structure. The raised frame structure of the bulk acoustic wave device 100 includes the raised frame layer 23.

FIG. 10B is a cross sectional view of a raised frame bulk acoustic wave device 104. The raised frame bulk acoustic wave device 104 includes a single layer raised frame structure. The raised frame structure of the bulk acoustic wave device 104 includes the raised frame layer 24.

FIG. 10C is a cross sectional view of a raised frame bulk acoustic wave device 108. The raised frame bulk acoustic wave device 108 includes a dual layer raised frame structure that includes both the raised frame layer 23 and the raised frame layer 24.

FIG. 11A is a graph that compares Q for the bulk acoustic wave devices 100, 104, and 108 of FIGS. 10A, 10B, and 10C, respectively. The bulk acoustic wave device 108 can provide better reflection of lateral energy than the bulk acoustic wave devices 104 and 108. FIG. 11A illustrates that the bulk acoustic wave device 108 can achieve a higher Q than the bulk acoustic wave devices 100 and 104.

FIG. 11B is a graph that compares conductance in decibels (dB) for the bulk acoustic wave devices 100, 104, and 108 of FIGS. 10A, 10B, and 10C, respectively, over a larger frequency range than for FIG. 11A. FIG. 11B illustrates that the bulk acoustic wave device 104 has relatively large noise at a frequency difference $F_{D3}$ from a resonant frequency, the bulk acoustic wave device 100 has relatively large noise at a frequency difference $F_{D2}$ from the resonant frequency, and the bulk acoustic wave device 108 has relatively large noise at a frequency difference $F_{D1}$ from a resonant frequency. The relatively large noise for these bulk acoustic devices at these frequency differences correspond to raised frame spurious modes. As shown in FIG. 11B, the frequency differences satisfy the following relationship: $F_{D1} > F_{D2} > F_{D3}$. The frequency difference $F_{D3}$ can be closer to the resonant frequency that desired for various applications. For instance, in the context of a multiplexer, the noise at the frequency difference $F_{D3}$ away from the resonant frequency can affect performance of a neighboring filter.

FIG. 11B indicates that the bulk acoustic wave device 108 has a raised frame spurious mode that is farther from the resonant frequency than the raised frame spurious modes of the bulk acoustic wave devices 100 and 104. As shown in FIG. 11B, there is almost 1 gigahertz (GHz) separation between the raised frame spurious mode and the resonant frequency for the bulk acoustic wave device 108. Accordingly, such a raised frame spurious mode should not affect other acoustic wave filters (e.g., one or more other acoustic wave filters of a multiplexer) arranged to filter a radio frequency signal having a frequency similar to the resonant frequency of the bulk acoustic wave device 108. This can be advantageous in carrier aggregation applications, for example.

FIG. 11B indicates that the bulk acoustic wave device 108 has a raised frame spurious mode with a lower magnitude than the raised frame spurious modes of the bulk acoustic wave devices 100 and 104.

The multi-layer raised frame bulk acoustic wave resonators disclosed herein can be implemented in acoustic wave filters. In certain applications, the acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Figure 12:
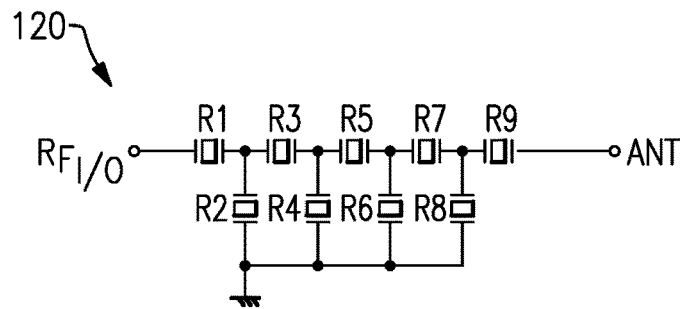
FIG. 12 is a schematic diagram of an example of an acoustic wave ladder filter.

FIG. 12 is a schematic diagram of an example of an acoustic wave ladder filter 120. The acoustic wave ladder filter 120 can be a transmit filter or a receive filter. The acoustic wave ladder filter 120 can be a band pass filter arranged to filter a radio frequency signal. The acoustic wave filter 120 includes series resonators R1, R3, R5, R7, and R9 and shunt resonators R2, R4, R6, and R8 coupled between a radio frequency input/output port $RF_{I/O}$ and an antenna port ANT. The radio frequency input/output port $RF_{I/O}$ can be a transmit port in a transmit filter or a receive port in a receive filter. One or more of the illustrated acoustic wave resonators can be a multi-layer raised frame bulk acoustic wave resonator in accordance with any suitable principles and advantages discussed herein. A acoustic wave ladder filter can include any suitable number of series resonators and any suitable number of shunt resonators.

A acoustic wave filter can be arranged in any other suitable filter topology, such as a lattice topology or a hybrid ladder and lattice topology. A bulk acoustic wave resonator in accordance with any suitable principles and advantages disclosed herein can be implemented in a band pass filter. In some other applications, a bulk acoustic wave resonator in accordance with any suitable principles and advantages disclosed herein can be implemented in a band stop filter.

Figure 13A:
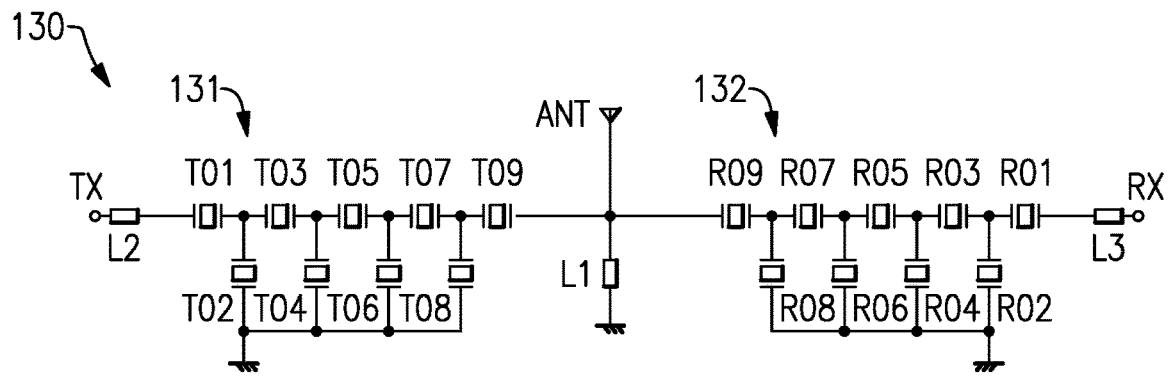
FIG. 13A is a schematic diagram of an example of a duplexer.

FIG. 13A is a schematic diagram of an example of a duplexer 130. The duplexer 130 includes a transmit filter 131 and a receive filter 132 coupled to each other at an antenna node ANT. A shunt inductor L1 can be connected to the antenna node ANT. The transmit filter 131 and the receive filter 132 are both acoustic wave ladder filters in the duplexer 130.

The transmit filter 131 can filter a radio frequency signal and provide a filtered radio frequency signal to the antenna node ANT. A series inductor L2 can be coupled between a transmit input node TX and the acoustic wave resonators of the transmit filter 131. The illustrated transmit filter 131 includes acoustic wave resonators T01 to T09. One or more of these resonators can be a multi-layer raised frame bulk acoustic wave resonator in accordance with any suitable principles and advantages disclosed herein. The illustrated receive filter includes acoustic wave resonators R01 to R09. One or more of these resonators can be a multi-layer raised frame bulk acoustic wave resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 13B:
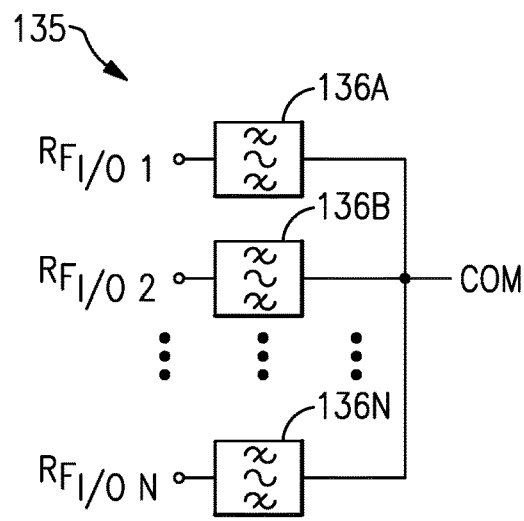
FIG. 13B is a schematic diagram of an example of a multiplexer.

FIG. 13B is a schematic diagram of a multiplexer 135 that includes an acoustic wave filter according to an embodiment. The multiplexer 135 includes a plurality of filters 136A to 136N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters 136A, 136B, and 136N is coupled between the common node COM and a respective input/output node $RF_{I/O1}$, $RF_{I/O2}$, and $RF_{I/ON}$.

In some instances, all filters of the multiplexer 135 can be receive filters. According to some other instances, all filters of the multiplexer 135 can be transmit filters. In various applications, the multiplexer 135 can include one or more transmit filters and one or more receive filters. Accordingly, the multiplexer 135 can include any suitable number of transmit filters and any suitable number of receive filters. Each of the illustrated filters can be band pass filters having different respective pass bands.

The multiplexer 135 is illustrated with hard multiplexing with the filters 136A to 136N having fixed connections to the common node COM. In some other applications, one or more of the filters of a multiplexer can be electrically connected to the common node by a respective switch. Any of such filters can include a bulk acoustic wave resonator according to any suitable principles and advantages disclosed herein.

A first filter 136A is an acoustic wave filter having a first pass band and arranged to filter a radio frequency signal. The first filter 136A can include one or more bulk acoustic wave resonators according to any suitable principles and advantages disclosed herein. A second filter 136B has a second pass band. A multi-layer raised frame structure of one or more bulk acoustic wave resonators of the first filter 136A can move a raised frame mode of the one or more bulk acoustic wave resonators away from the second passband. This can increase a reflection coefficient (Gamma) of the first filter 136A in the pass band of the second filter 136B. The multi-layer raised frame structure of the bulk acoustic wave resonator of the first filter 136A also move the raised frame mode away from the passband of one or more other filters of the multiplexer 135.

In certain instances, the common node COM of the multiplexer 135 is arranged to receive a carrier aggregation signal including at least a first carrier associated with the first passband of the first filter 136A and a second carrier associated with the second passband of the second filter 136B. A multi-layer raised frame structure of a bulk acoustic wave resonator of the first filter 136A can maintain and/or increase a reflection coefficient of the first filter 136A in the second passband of the second filter 136B that is associated with the second carrier of the carrier aggregation signal.

The filters 136B to 136N of the multiplexer 135 can include one or more acoustic wave filters, one or more acoustic wave filters that include at least one bulk acoustic wave resonator with a multi-layer raised frame structure, one or more LC filters, one or more hybrid acoustic wave LC filters, or any suitable combination thereof.

The multi-layer raised frame bulk acoustic wave resonators disclosed herein can be implemented in a variety of packaged modules. Some example packaged modules will now be discussed in which any suitable principles and advantages of the bulk acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 14, 15A, 15B, and 16 are schematic block diagrams of illustrative packaged modules according to certain embodiments. Certain example packaged modules include one or more radio frequency amplifiers, such as one or more power amplifiers and/or one or more low noise amplifiers. Any suitable combination of features of these modules can be implemented with each other. While duplexers are illustrated in the example packaged modules of FIGS. 14, 15A, and 16, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 14:
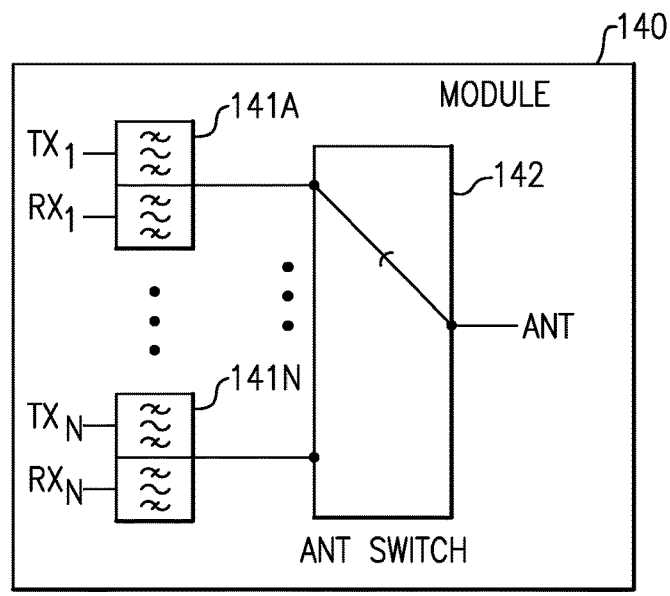
FIG. 14 is a schematic block diagram of a module that includes an antenna switch and duplexers that include one or more multi-layer raised frame bulk acoustic wave devices.

FIG. 14 is a schematic block diagram of a module 140 that includes duplexers 141A to 141N and an antenna switch 142. One or more filters of the duplexers 141A to 141N can include any suitable number of multi-layer raised frame bulk acoustic wave resonators in accordance with any suitable principles and advantages discussed herein. Any suitable number of duplexers 141A to 141N can be implemented. The antenna switch 142 can have a number of throws corresponding to the number of duplexers 141A to 141N. The antenna switch 142 can electrically couple a selected duplexer to an antenna port of the module 140.

Figure 15A:
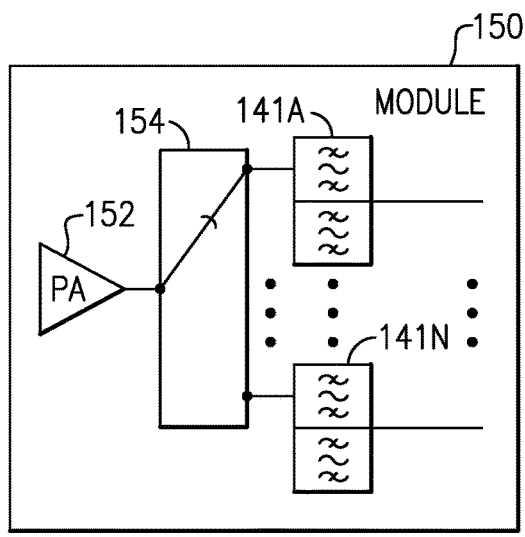
FIG. 15A is a schematic block diagram of a module that includes a power amplifier, a radio frequency switch, and duplexers that include one or more multi-layer raised frame bulk acoustic wave devices.

FIG. 15A is a schematic block diagram of a module 150 that includes a power amplifier 152, a radio frequency switch 154, and duplexers 141A to 141N in accordance with one or more embodiments. The power amplifier 152 can amplify a radio frequency signal. The radio frequency switch 154 can be a multi-throw radio frequency switch. The radio frequency switch 154 can electrically couple an output of the power amplifier 152 to a selected transmit filter of the duplexers 141A to 141N. One or more filters of the duplexers 141A to 141N can include any suitable number of multi-layer raised frame bulk acoustic wave resonators in accordance with any suitable principles and advantages discussed herein. Any suitable number of duplexers 141A to 141N can be implemented.

Figure 15B:
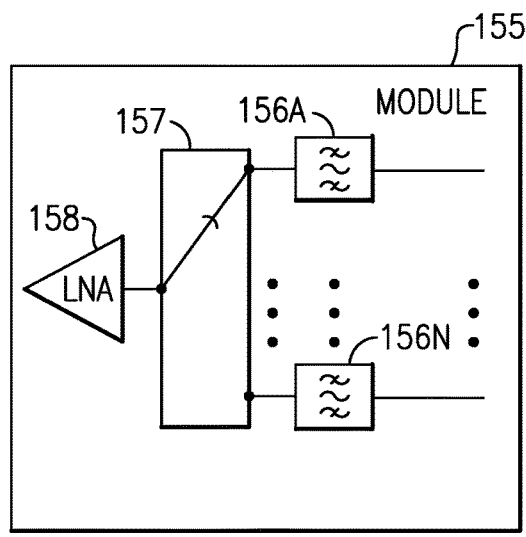
FIG. 15B is a schematic block diagram of a module that includes a low noise amplifier, a radio frequency switch, and acoustic wave filters t include one or more multi-layer raised frame bulk acoustic wave devices.

FIG. 15B is a schematic block diagram of a module 155 that includes filters 156A to 156N, a radio frequency switch 157, and a low noise amplifier 158 according to an embodiment. One or more filters of the filters 156A to 156N can include any suitable number of multi-layer raised frame bulk acoustic wave resonators in accordance with any suitable principles and advantages disclosed herein. Any suitable number of filters 156A to 156N can be implemented. The illustrated filters 156A to 156N are receive filters. In some embodiments (not illustrated), one or more of the filters 156A to 156N can be included in a multiplexer that also includes a transmit filter. The radio frequency switch 157 can be a multi-throw radio frequency switch. The radio frequency switch 157 can electrically couple an output of a selected filter of filters 156A to 156N to the low noise amplifier 157. In some embodiments (not illustrated), a plurality of low noise amplifiers can be implemented. The module 155 can include diversity receive features in certain applications.

Figure 16:
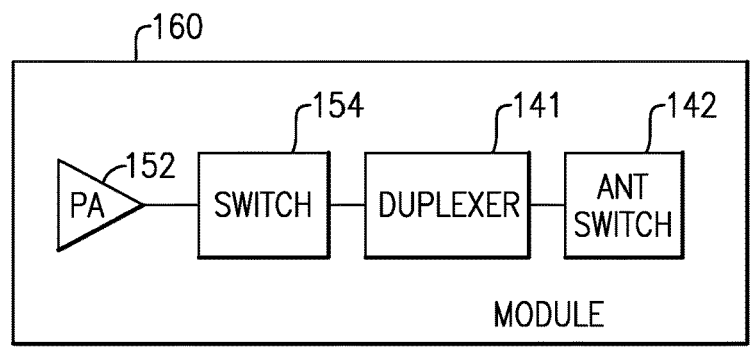
FIG. 16 is a schematic block diagram of a module that includes a power amplifier, a radio frequency switch, a duplexer that includes one or more multi-layer raised frame bulk acoustic wave devices.

FIG. 16 is a schematic block diagram of a module 160 that includes a power amplifier 152, a radio frequency switch 154, and a duplexer 141 that includes a multi-layer raised frame bulk acoustic wave device in accordance with one or more embodiments, and an antenna switch 142. The module 160 can include elements of the module 140 and elements of the module 150.

Figure 17A:
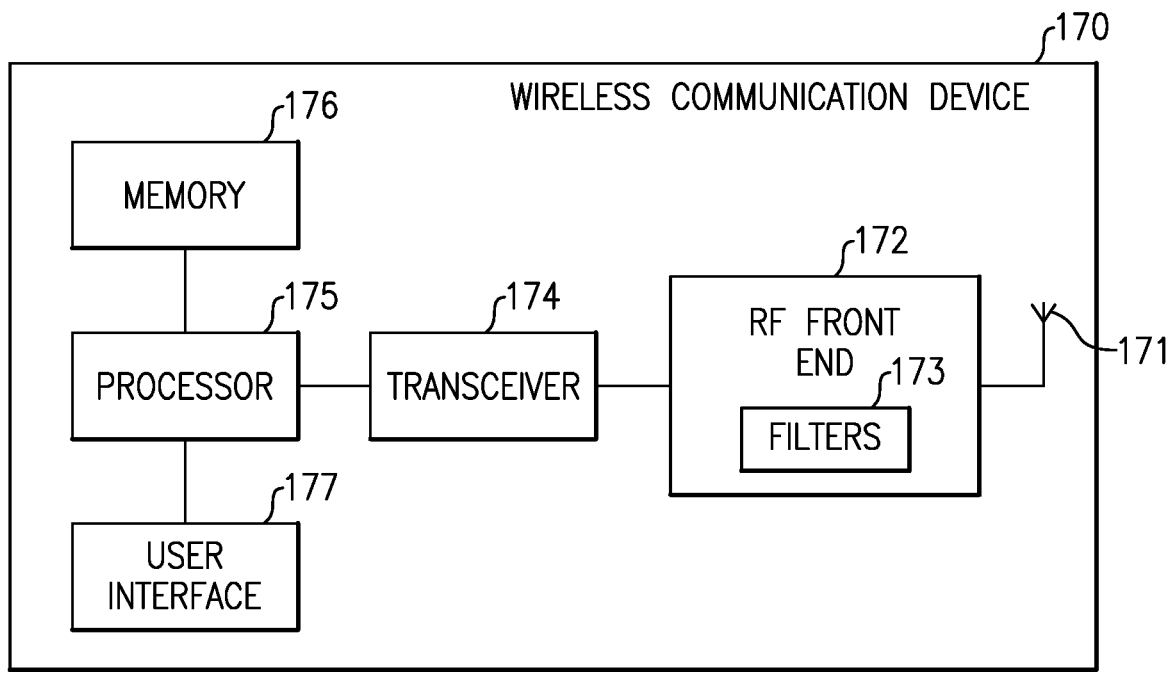
FIG. 17A is a schematic block diagram of a wireless communication device that includes filters that include one or more multi-layer raised frame bulk acoustic wave devices.

One or more filters with any suitable number of multi-layer raised frame bulk acoustic devices can be implemented in a variety of wireless communication devices. FIG. 17A is a schematic block diagram of a wireless communication device 170 that includes a filter 173 with one or more multi-layer raised frame bulk acoustic wave resonators in accordance with any suitable principles and advantages disclosed herein. The wireless communication device 170 can be any suitable wireless communication device. For instance, a wireless communication device 170 can be a mobile phone, such as a smart phone. As illustrated, the wireless communication device 170 includes an antenna 171, a radio frequency (RF) front end 172 that includes filter 173, an RF transceiver 174, a processor 175, a memory 176, and a user interface 177. The antenna 171 can transmit RF signals provided by the RF front end 172. The antenna 171 can provide received RF signals to the RF front end 172 for processing.

The RF front end 172 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 172 can transmit and receive RF signals associated with any suitable communication standards. Any of the multi-layer raised frame bulk acoustic wave resonators disclosed herein can be implemented in filters 173 of the RF front end 172.

The RF transceiver 174 can provide RF signals to the RF front end 172 for amplification and/or other processing. The RF transceiver 174 can also process an RF signal provided by a low noise amplifier of the RF front end 172. The RF transceiver 174 is in communication with the processor 175. The processor 175 can be a baseband processor. The processor 175 can provide any suitable base band processing functions for the wireless communication device 170. The memory 176 can be accessed by the processor 175. The memory 176 can store any suitable data for the wireless communication device 170. The processor 175 is also in communication with the user interface 177. The user interface 177 can be any suitable user interface, such as a display.

Figure 17B:
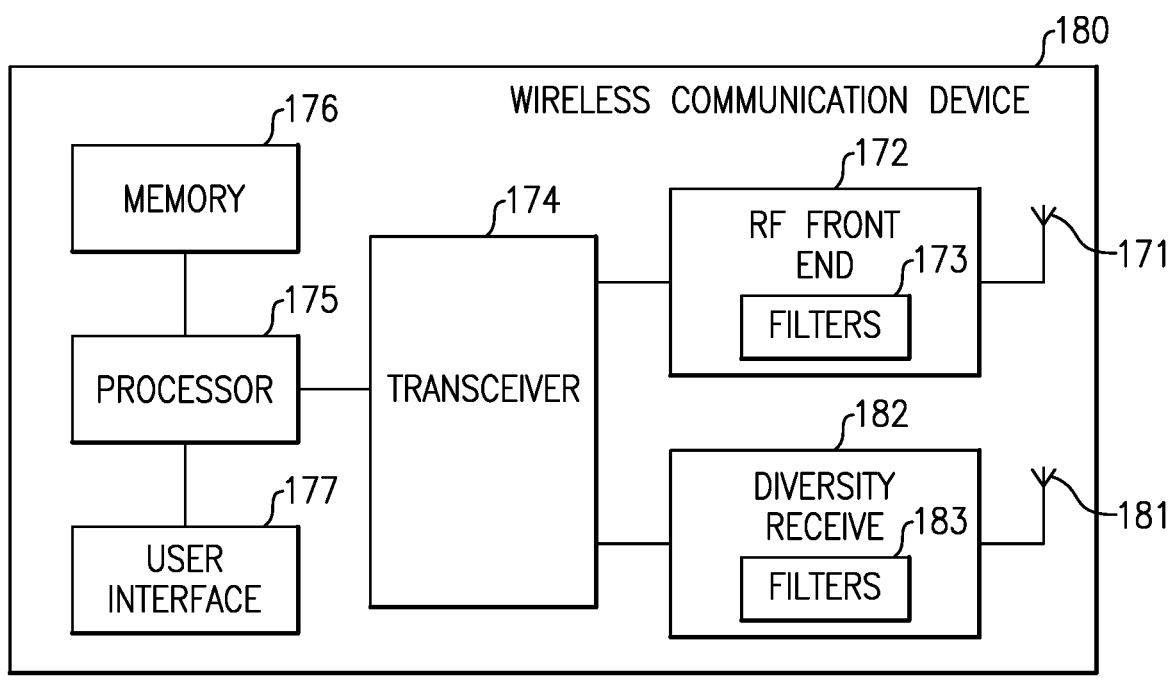
FIG. 17B is a schematic block diagram of another wireless communication device that includes filters that include one or more multi-layer raised frame bulk acoustic wave devices.

FIG. 17B is a schematic diagram of a wireless communication device 180 that includes filters 173 in a radio frequency front end 172 and second filters 183 in a diversity receive module 182. The wireless communication device 180 is like the wireless communication device 170 of FIG. 17A, except that the wireless communication device 180 also includes diversity receive features. As illustrated in FIG. 17B, the wireless communication device 180 includes a diversity antenna 181, a diversity module 182 configured to process signals received by the diversity antenna 181 and including filters 183, and a transceiver 174 in communication with both the radio frequency front end 172 and the diversity receive module 182. One or more of the second filters 183 can include a bulk acoustic wave resonator with a multi-layer raised frame structure in accordance with any suitable principles and advantages disclosed herein.

Bulk acoustic wave devices disclosed herein can be included in a filter and/or a multiplexer arranged to filter a radio frequency signal in a fifth generation (5G) New Radio (NR) operating band within Frequency Range 1 (FR1). FR1 can range from 410 megahertz (MHz) to 7.125 gigahertz (GHz), for example, as specified in a current 5G NR specification. A filter arranged to filter a radio frequency signal in a 5G NR FR1 operating band can include one or more bulk acoustic wave resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Bulk acoustic wave resonators with a multi-layer raised frame structure disclosed herein can achieve low insertion loss and low Gamma loss. The frequency of a raised frame mode of such a bulk acoustic wave resonator can be moved significantly away from a resonant frequency of the bulk acoustic wave resonator. Accordingly, the raised frame mode can be outside of a carrier aggregation band even with the wider carrier aggregation bandwidth and/or channel spacing within FR1 in 5G specifications. This can reduce and/or eliminate Gamma degradation in an operating band of another carrier of a carrier aggregation. In some instances, Gamma can be increased in the operating band of the other carrier of the carrier aggregation.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:
1. A bulk acoustic wave device comprising:
   a first electrode;
   a second electrode;

a piezoelectric layer positioned between the first electrode and the second electrode; and a multi-layer raised frame structure outside of a middle area of an active region of the bulk acoustic wave device, the multi-layer raised frame structure including a first raised frame layer and a second raised frame layer, the first raised frame layer being positioned between the first electrode and the second electrode, the first raised frame layer having a lower acoustic impedance than the first electrode, the first raised frame layer being configured to move a frequency of a raised frame mode away from a main resonant frequency of the bulk acoustic wave device, and the second raised frame layer overlapping with the first raised frame layer in the active region.

2. The bulk acoustic wave device of claim 1 wherein the multi-layer raised frame structure is configured to block lateral energy leakage from the active region to a passive region of the bulk acoustic wave device.

3. The bulk acoustic wave device of claim 1 wherein the acoustic impedance of the first raised frame layer is lower than an acoustic impedance of the piezoelectric layer.

4. The bulk acoustic wave device of claim 1 wherein the first raised frame layer is a silicon dioxide layer.

5. The bulk acoustic wave device of claim 1 wherein the first electrode includes at least one of molybdenum, tungsten, ruthenium, platinum, or iridium.

6. The bulk acoustic wave device of claim 1 wherein the first raised frame layer is positioned between the piezoelectric layer and the first electrode.

7. The bulk acoustic wave device of claim 1 wherein the first raised frame layer is disposed in a raised frame domain of the bulk acoustic wave device along an edge of the active domain.

8. The bulk acoustic wave device of claim 7 wherein the bulk acoustic wave device further includes a recessed frame domain between the raised frame domain and the middle area.

9. The bulk acoustic wave device of claim 1 wherein the second raised frame layer and the piezoelectric layer are disposed on opposite sides of the second electrode, and the first raised frame layer is positioned between the piezoelectric layer and the second electrode.

10. The bulk acoustic wave device of claim 1 wherein the second raised frame layer has a higher density than the piezoelectric layer.

11. The bulk acoustic wave device of claim 1 wherein the second raised frame layer includes the same material as the second electrode.

12. The bulk acoustic wave device of claim 1 further comprising an air cavity, the air cavity and the piezoelectric layer being on opposite sides of the first electrode.

13. The bulk acoustic wave device of claim 1 further comprising an acoustic Bragg reflector, the acoustic Bragg reflector and the piezoelectric layer being on opposite sides of the first electrode.

14. A packaged module comprising:
a packaging substrate;
an acoustic wave filter on the packaging substrate and configured to filter a radio frequency signal, the acoustic wave filter including a bulk acoustic wave device, the bulk acoustic wave device including a multi-layer raised frame structure outside of a middle area of an active region of the bulk acoustic wave device, the multi-layer raised frame structure including a first raised frame layer and a second raised frame layer, the first raised frame layer being positioned between an electrode and a piezoelectric layer, the first raised frame layer having a lower acoustic impedance than the electrode, the first raised frame layer being configured to move a frequency of a raised frame mode away from a main resonant frequency of the bulk acoustic wave device, and the second raised frame layer overlapping with the first raised frame layer in the active region; and a radio frequency component electrically coupled to the acoustic wave filter and positioned on the packaging substrate, the acoustic wave filter and the radio frequency component being enclosed within a common package.

15. The packaged module of claim 14 wherein the radio frequency component includes at least one of a radio frequency amplifier or a radio frequency switch.

16. The packaged module of claim 14 wherein the multi-layer raised frame structure is disposed in a raised frame domain of the bulk acoustic wave device, and the bulk acoustic wave device includes a recessed frame domain between the raised frame domain and the middle area of the active region of the bulk acoustic wave device.

17. A bulk acoustic wave device comprising:
a first electrode;
a second electrode;
a piezoelectric layer positioned between the first electrode and the second electrode; and
a multi-layer raised frame structure including a first raised frame layer and a second raised frame layer, the first raised frame layer being positioned between the first electrode and the second electrode, the first raised frame layer having a lower acoustic impedance than the second raised frame layer, the first raised frame layer being configured to move a frequency of a raised frame mode away from a main resonant frequency of the bulk acoustic wave device, and the second raised frame layer overlapping with the first raised frame layer.

18. The bulk acoustic wave device of claim 17 wherein the multi-layer raised frame structure is disposed in a raised frame domain of the bulk acoustic wave device, and the bulk acoustic wave device includes a recessed frame domain between the raised frame domain and a middle area of the bulk acoustic wave device.

19. The bulk acoustic wave device of claim 18 further comprising a passivation layer over the first electrode, the passivation layer being thinner in the recessed frame domain than in the middle area of the bulk acoustic wave device.

20. The bulk acoustic wave device of claim 18 wherein the first electrode is thinner in the recessed frame domain than in the middle area of the bulk acoustic wave device.

21. The bulk acoustic wave device of claim 17 wherein the first raised frame layer includes silicon dioxide.

22. The bulk acoustic wave device of claim 17 wherein the first electrode is positioned between the second raised frame layer and the piezoelectric layer.

* * * * *